(12) United States Patent
Seng et al.

(10) Patent No.: US 7,365,424 B2
(45) Date of Patent: Apr. 29, 2008

(54) MICROELECTRONIC COMPONENT ASSEMBLIES WITH RECESSED WIRE BONDS AND METHODS OF MAKING SAME

(75) Inventors: Eric Tan Swee Seng, Singapore (SG); Edmund Low Kwok Chung, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/437,397

(22) Filed: May 18, 2006

(65) Prior Publication Data

US 2006/0208366 A1 Sep. 21, 2006

Related U.S. Application Data

(62) Division of application No. 10/929,640, filed on Aug. 30, 2004, now Pat. No. 7,250,328.

(30) Foreign Application Priority Data

Jul. 23, 2004 (SG) ............................. 200404238-8

(51) Int. Cl.
*H01L 23/12* (2006.01)
*H01L 23/28* (2006.01)
*H01L 23/495* (2006.01)

(52) U.S. Cl. ...................... 257/711; 257/433; 257/668; 257/787; 438/612; 438/617

(58) Field of Classification Search ................ 438/617, 438/612, 15, 25, 26; 257/100, 433, 667, 257/668, 787, 788, E31.117, E31.118, E51.02, 257/711, E23.001, E23.003, E23.058
See application file for complete search history.

(56) References Cited

U.S. PATENT DOCUMENTS

| | | | |
|---|---|---|---|
| 4,996,629 A | * | 2/1991 | Christiansen et al. ....... 361/783 |
| 5,062,565 A | | 11/1991 | Wood et al. |
| 5,128,831 A | | 7/1992 | Fox, III et al. |

(Continued)

FOREIGN PATENT DOCUMENTS

EP 0 204 102 A2 12/1986

(Continued)

OTHER PUBLICATIONS

Search Report and Written Opinion for Singapore Patent Application No. SG200404238-8, 2 pages, Mar. 1, 2006.

(Continued)

*Primary Examiner*—Long K. Tran
(74) *Attorney, Agent, or Firm*—Perkins Coie LLP

(57) ABSTRACT

The present disclosure suggests various microelectronic component assembly designs and methods for manufacturing microelectronic component assemblies. In one particular implementation, a microelectronic component assembly includes a microelectronic component, a substrate, and at least one bond wire. The substrate has a reduced-thickness base adjacent terminals of the microelectronic component and a body having a contact surface spaced farther from the microelectronic component than a bond pad surface of the base. The bond wire couples the microelectronic component to a bond pad carried by the bond pad surface and has a maximum height outwardly from the microelectronic component that is no greater than the height of the contact surface from the microelectronic component.

10 Claims, 2 Drawing Sheets

U.S. PATENT DOCUMENTS

| | | | |
|---|---|---|---|
| 5,145,099 A | 9/1992 | Wood et al. | |
| 5,153,981 A * | 10/1992 | Soto | 29/701 |
| 5,252,857 A | 10/1993 | Kane et al. | |
| 5,311,057 A | 5/1994 | McShane | |
| 5,518,957 A | 5/1996 | Kim | |
| 5,593,927 A | 1/1997 | Farnworth et al. | |
| 5,677,566 A | 10/1997 | King et al. | |
| 5,696,033 A | 12/1997 | Kinsman | |
| 5,714,800 A | 2/1998 | Thompson | |
| 5,739,585 A | 4/1998 | Akram et al. | |
| D394,844 S | 6/1998 | Wood et al. | |
| 5,818,698 A | 10/1998 | Corisis | |
| 5,826,628 A | 10/1998 | Hamilton | |
| 5,834,831 A | 11/1998 | Kubota et al. | |
| D402,638 S | 12/1998 | Wood et al. | |
| 5,851,845 A | 12/1998 | Wood et al. | |
| 5,879,965 A | 3/1999 | Jiang et al. | |
| 5,883,426 A | 3/1999 | Tokuno et al. | |
| 5,891,753 A | 4/1999 | Akram | |
| 5,891,797 A | 4/1999 | Farrar | |
| 5,893,726 A | 4/1999 | Farnworth et al. | |
| 5,894,218 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,958,100 A | 9/1999 | Farnworth et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 5,998,860 A * | 12/1999 | Chan et al. | 257/679 |
| 6,008,070 A | 12/1999 | Farnworth | |
| 6,008,074 A | 12/1999 | Brand | |
| 6,018,249 A | 1/2000 | Akram et al. | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,049,129 A | 4/2000 | Yew et al. | |
| 6,051,878 A | 4/2000 | Akram et al. | |
| 6,064,194 A | 5/2000 | Farnworth et al. | |
| 6,072,233 A | 6/2000 | Corisis et al. | |
| 6,072,236 A | 6/2000 | Akram et al. | |
| 6,075,288 A | 6/2000 | Akram | |
| 6,087,203 A | 7/2000 | Eng et al. | |
| 6,089,920 A | 7/2000 | Farnworth et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,130,474 A | 10/2000 | Corisis | |
| 6,133,068 A | 10/2000 | Kinsman | |
| 6,133,622 A | 10/2000 | Corisis et al. | |
| 6,137,162 A | 10/2000 | Park et al. | |
| 6,148,509 A | 11/2000 | Schoenfeld et al. | |
| 6,150,710 A | 11/2000 | Corisis | |
| 6,150,717 A | 11/2000 | Wood et al. | |
| 6,153,924 A | 11/2000 | Kinsman | |
| 6,159,764 A | 12/2000 | Kinsman et al. | |
| 6,172,419 B1 | 1/2001 | Kinsman | |
| 6,175,149 B1 | 1/2001 | Akram | |
| 6,184,465 B1 | 2/2001 | Corisis | |
| 6,188,232 B1 | 2/2001 | Akram et al. | |
| 6,198,172 B1 | 3/2001 | King et al. | |
| 6,201,304 B1 | 3/2001 | Moden | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,214,716 B1 | 4/2001 | Akram | |
| 6,215,175 B1 | 4/2001 | Kinsman | |
| 6,218,202 B1 * | 4/2001 | Yew et al. | 438/15 |
| 6,225,689 B1 | 5/2001 | Moden et al. | |
| 6,228,548 B1 | 5/2001 | King et al. | |
| 6,229,202 B1 | 5/2001 | Corisis | |
| 6,232,666 B1 | 5/2001 | Corisis et al. | |
| 6,235,554 B1 | 5/2001 | Akram et al. | |
| 6,239,489 B1 | 5/2001 | Jiang | |
| 6,246,108 B1 | 6/2001 | Corisis et al. | |
| 6,246,110 B1 | 6/2001 | Kinsman et al. | |
| 6,247,629 B1 | 6/2001 | Jacobson et al. | |
| 6,249,052 B1 | 6/2001 | Lin | |
| 6,252,308 B1 | 6/2001 | Akram et al. | |
| 6,252,772 B1 | 6/2001 | Allen | |
| 6,258,623 B1 | 7/2001 | Moden et al. | |
| 6,258,624 B1 | 7/2001 | Corisis | |
| 6,259,153 B1 | 7/2001 | Corisis | |
| 6,261,865 B1 | 7/2001 | Akram | |
| 6,265,766 B1 | 7/2001 | Moden | |
| 6,271,580 B1 | 8/2001 | Corisis | |
| 6,277,671 B1 | 8/2001 | Tripard | |
| 6,281,042 B1 | 8/2001 | Ahn et al. | |
| 6,281,577 B1 | 8/2001 | Oppermann et al. | |
| 6,284,571 B1 | 9/2001 | Corisis et al. | |
| 6,285,204 B1 | 9/2001 | Farnworth | |
| 6,291,894 B1 | 9/2001 | Farnworth et al. | |
| 6,294,825 B1 | 9/2001 | Bolken et al. | |
| 6,294,839 B1 | 9/2001 | Mess et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,222 B1 | 12/2001 | Corisis et al. | |
| 6,329,705 B1 | 12/2001 | Ahmad | |
| 6,331,221 B1 | 12/2001 | Cobbley | |
| 6,331,448 B1 | 12/2001 | Ahmad | |
| 6,331,453 B1 | 12/2001 | Bolken et al. | |
| 6,332,766 B1 | 12/2001 | Thummel | |
| 6,344,976 B1 | 2/2002 | Schoenfeld et al. | |
| 6,365,434 B1 | 4/2002 | Rumsey et al. | |
| 6,385,049 B1 * | 5/2002 | Chia-Yu et al. | 361/721 |
| 6,387,729 B2 * | 5/2002 | Eng et al. | 438/106 |
| 6,420,782 B1 | 7/2002 | Eng et al. | |
| 6,429,528 B1 | 8/2002 | King et al. | |
| 6,437,586 B1 | 8/2002 | Robinson | |
| 6,451,709 B1 | 9/2002 | Hembree | |
| 6,483,044 B1 | 11/2002 | Ahmad | |
| 6,521,993 B2 | 2/2003 | Masayuki et al. | |
| 6,548,376 B2 | 4/2003 | Jiang | |
| 6,548,757 B1 | 4/2003 | Russell et al. | |
| 6,552,910 B1 | 4/2003 | Moon et al. | |
| 6,558,600 B1 | 5/2003 | Williams et al. | |
| 6,560,117 B2 | 5/2003 | Moon | |
| 6,561,479 B1 | 5/2003 | Eldridge | |
| 6,564,979 B2 | 5/2003 | Savaria | |
| 6,576,494 B1 | 6/2003 | Farnworth | |
| 6,576,495 B1 | 6/2003 | Jiang et al. | |
| 6,589,820 B1 | 7/2003 | Bolken | |
| 6,590,281 B2 | 7/2003 | Wu et al. | |

| | | |
|---|---|---|
| 6,607,937 B1 | 8/2003 | Corisis |
| 6,614,092 B2 | 9/2003 | Eldridge et al. |
| 6,622,380 B1 | 9/2003 | Grigg |
| 6,638,595 B2 | 10/2003 | Rumsey et al. |
| 6,644,949 B2 | 11/2003 | Rumsey et al. |
| 6,650,013 B2 | 11/2003 | Yin et al. |
| 6,653,173 B2 | 11/2003 | Bolken |
| 6,656,769 B2 | 12/2003 | Lee et al. |
| 6,661,104 B2 | 12/2003 | Jiang et al. |
| 6,664,139 B2 | 12/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,841,863 B2 | 1/2005 | Baik et al. |
| 7,057,281 B2 | 6/2006 | Peng et al. |
| 2003/0127712 A1 | 7/2003 | Murakami et al. |
| 2004/0173899 A1 | 9/2004 | Peng et al. |
| 2006/0017177 A1 | 1/2006 | Seng et al. |

FOREIGN PATENT DOCUMENTS

| | | |
|---|---|---|
| EP | 0 240 433 A2 | 10/1987 |
| EP | 0 753 891 A2 | 1/1997 |
| EP | 0 849 794 A1 | 6/1998 |
| EP | 0921569 A1 | 6/1999 |
| JP | 01-309357 | 12/1989 |
| JP | 2000-307032 A | 11/2000 |
| WO | WO-02/082527 A1 | 10/2002 |

OTHER PUBLICATIONS

Hmiel, A. F. et al., "A Novel Process for Protecting Wire Bonds From Sweep During Molding", 8 pages, International Electronics Manufacturing Technology Symposium, Jul. 17-18, 2002, IEEE.

Chylak, B. et al., "Overcoming the Key Barriers in 35 μm Pitch Wire Bond Packaging: Probe, Mold, and Substrate Solutions and Trade-offs", 6 pages, International Electronics Manufacturing Technology Symposium, Jul. 17-18, 2002, IEEE.

Kulicke & Soffa, NoSWEEP® Wire Bond Encapsulant, 1 page, retrieved from the Internet on Jan. 2, 2003, <http://www.kns.com/prodserv/Polymers/NoSweep.asp>.

* cited by examiner

MICROELECTRONIC COMPONENT ASSEMBLIES WITH RECESSED WIRE BONDS AND METHODS OF MAKING SAME

CROSS-REFERENCE TO RELATED APPLICATION

This application claims foreign priority benefits of Singapore Application No. 200404238-8 filed Jul. 23, 2004, in the name of Micron Technology, Inc., and entitled "MICROELECTRONIC COMPONENT ASSEMBLIES WITH RECESSED WIRE BONDS AND METHODS OF MAKING SAME," and is a divisional of application Ser. No. 10/929,640, filed on Aug. 30, 2004 now U.S. Pat. No. 7,250,328, the entirety of which is incorporated herein by reference.

TECHNICAL FIELD

The present invention relates to microelectronic components. In particular, aspects of the invention relate to microelectronic component assemblies and methods of manufacturing microelectronic component assemblies. Certain embodiments of the invention provide packaged microelectronic component assemblies.

BACKGROUND

Semiconductor chips or dies typically are manufactured from a semiconductor material such as silicon, germanium, or gallium/arsenide. An integrated circuit or other active feature(s) is incorporated in the die adjacent one surface, often referred to as the "active surface," of the die. The active surface typically also includes input and output terminals to facilitate electrical connection of the die with another microelectronic component.

Since semiconductor dies can be degraded by exposure to moisture and other chemical attack, most dies are encapsulated in a package that protects the dies from the surrounding environment. The packages typically include leads or other connection points that allow the encapsulated die to be electrically coupled to another electronic component, e.g., a printed circuit board. One common package design, referred to as a board-on-chip (BOC) package, includes a semiconductor die attached to a small circuit board, e.g., via a die attach adhesive. Some or all of the terminals of the semiconductor die then may be electrically be connected to a first set of contacts of the board, e.g., by wire bonding. The connected board and die may then be encapsulated in a mold compound to complete the packaged microelectronic component assembly. A second set of contacts carried on an outer surface of the board remain exposed; these exposed contacts are electrically connected to the first contacts, allowing the features of the semiconductor die to be electrically accessed.

FIG. 1 schematically illustrates a conventional packaged microelectronic component assembly 10. This microelectronic component assembly 10 includes a semiconductor die 20 having an front surface 22, which bears an array of terminals 24, and a back surface 26. This microelectronic component assembly 10 is a conventional BOC package in which a back side 32 of a circuit board 30 is attached to the front surface 22 of the die 20 by adhesive members 35a and 35b. A passage 34 is formed through the entire thickness of the board 30 and permits access to the terminals 24 of the die 20 by a wire bonding machine or the like. The first adhesive member 35a extends adjacent one side of the passage 34 and the second adhesive member 35b extends along the opposite side of the passage 34.

The microelectronic component assembly 10 also includes a plurality of bond wires 40. A first set of bond wires 40a may extend from individual terminals 24 of the die 20 to a first set of bond pads 32a arranged on the front side 36 of the board 30 along a first side of the passage 34. Similarly, a series of second bond wires 40b may extend from other terminals 24 in the terminal array to a second set of bond pads 32b arranged on the front side 36 along the opposite side of the passage 34. Typically, these bond wires 40 are attached using wire-bonding machines that spool a length of wire through a capillary. A molten ball may be formed at a protruding end of the wire and the capillary may push this molten ball against one of the terminals 24, thereby attaching the terminal end 42 of the wire 40 to the die 20. The capillary moves laterally in a direction away from the bond pad 32 to which the wire 40 will be attached (referred to as the reverse motion of the capillary), then a further length of the wire will be spooled out and the board end 44 of the wire 40 will be attached to the bond pad 32. The reverse motion of the capillary is required to bend the wire into the desired shape to avoid undue stress at either the terminal end 42 or the board end 44. The need to move the capillary in the reverse direction to form the bend in the wire 40 requires significant clearance between the terminal end 42 and the inner surface of the passage 34, increasing the width W of the passage 34. The reverse motion also increases the length of each of the bond wires 40 and often requires an increased loop height L of the wire 40 outwardly from the front surface 22 of the die 20.

As noted above, most commercial microelectronic component assemblies are packaged in a mold compound 50. The mold compound 50 typically encapsulates the die 20, the adhesive members 35, the bond wires 40, and an inner portion of the board 30. A remainder of the board 30 extends laterally outwardly from the sides of the mold compound 50. In many conventional applications, the mold compound 50 is delivered using transfer molding processes in which a molten dielectric compound is delivered under pressure to a mold cavity having the desired shape. In conventional side gate molds, the mold compound will flow from one side of the cavity to the opposite side. As the front of the molten dielectric compound flows along the passage 34 under pressure, it will tend to deform the wires. This deformation, commonly referred to as "wire sweep," can cause adjacent wires 40 to abut one another, creating an electrical short. Wire sweep may also cause one of the wires 40 to bridge two adjacent leads, creating an electrical short between the two leads. These problems become more pronounced as the wire pitch becomes smaller and as thinner wires 40 are used.

To protect the bond wires, a conventional BOC package is positioned in the mold cavity with the die oriented downwardly and the substrate oriented upwardly, i.e., generally in the orientation illustrated in FIG. 1. The mold compound 50 commonly flows longitudinally along the length of the passage 34 (in a direction perpendicular to the plane of the cross sectional view of FIG. 1) to create the lower portion of the mold compound 50, then flows in the opposite direction along the back side 32 of the board 30 to create the upper portion of the mold compound. In an attempt to keep the exposed portion of the substrate's front side 36 exposed, the back side 32 of the board 30 is typically supported by pins that extend upwardly from the bottom of the mold. The pressure of the mold compound 50 flowing along the passage 34, however, can force mold compound between the front face 36 if the board 30 and the surface of the mold cavity, leaving a flash coating of the mold compound on the front face 36. This flash coating must be removed before use if the contacts 37 on the front face 36 are used to electrically couple the microelectronic component assembly 10 to another component.

DETAILED DESCRIPTION

A. Overview

Various embodiments of the present invention provide various microelectronic component assemblies and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

For ease of understanding, the following discussion is subdivided into two areas of emphasis. The first section discusses microelectronic component assemblies in accordance with- selected embodiments of the invention. The second section outlines methods in accordance with other embodiments of the invention.

B. Microelectronic Component Assemblies Having Recessed Wire Bonds

Figure 2:
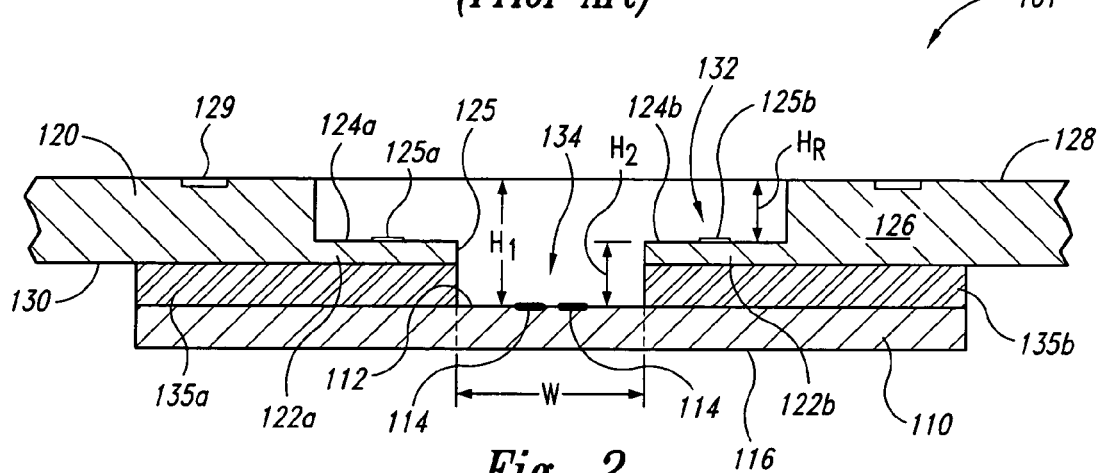
FIG. 2 is a schematic cross-sectional view of a microelectronic component subassembly in accordance with one embodiment of the invention.
Figure 3:
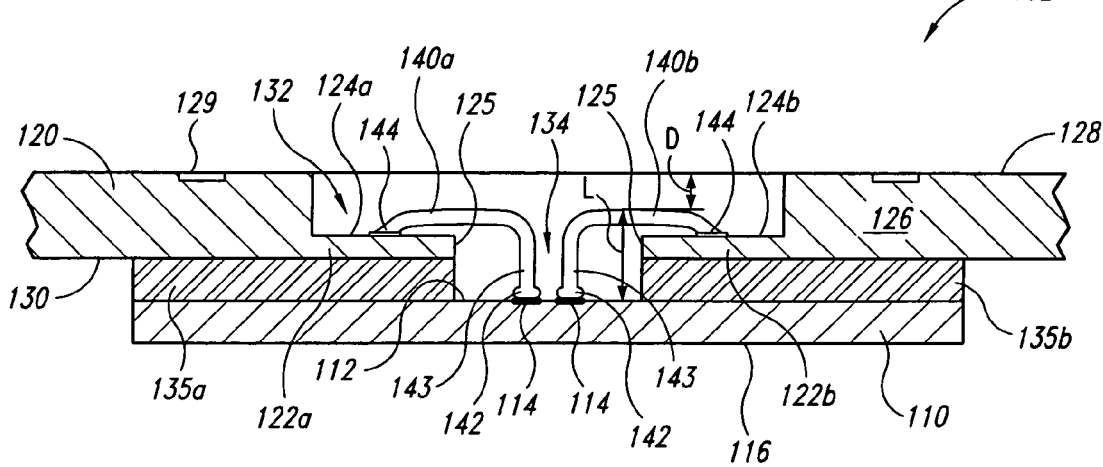
FIG. 3 is a schematic cross-sectional view of the microelectronic component subassembly of FIG. 2 after the addition of bonding wires.

FIGS. 2 and 3 schematically illustrate microelectronic component subassemblies in accordance with selected embodiments of the invention. These microelectronic components are referred to herein as subassemblies primarily because they are unlikely to be sold commercially in this fashion and instead represent an intermediate stage in the manufacture of a commercial device, e.g., the packaged microelectronic component assembly 100 of FIG. 4.

Turning first to FIG. 2, the microelectronic component subassembly 101 shown therein includes a microelectronic component 110 and a substrate 120.

The microelectronic component 110 has an active surface 112 and a back surface 116. The active surface 112 carries an array of terminals 114. In one embodiment (not shown), the terminals 114 are aligned along a longitudinal midline of the microelectronic component 110. In the illustrated embodiment, the terminals 114 are arranged in a longitudinally extending array in which the terminals 114 are staggered along either side the midline of the microelectronic component. As is known in the art, such a staggered arrangement can facilitate a smaller wire pitch, increasing the maximum number of terminals 114 in a given length. Arrays in which the terminals 114 are more widely distributed on the active surface 112 may be used instead.

The microelectronic component 110 may comprise a single microelectronic component or a subassembly of separate microelectronic components. In the embodiment shown in FIG. 2, the microelectronic component 110 is typified as a single semiconductor die. In one particular implementation, the microelectronic component 110 comprises a memory element, e.g., SIMM, DRAM, or flash memory. In other implementations, the microelectronic component 110 may comprise an ASIC or a processor, for example.

The substrate 120 may include a back surface 130 and a contact surface 128 that carries a plurality of contacts 129. The distance between the back surface and the contact surface defines a thickness of a body 126 of the substrate 120. A recess 132 in the substrate extends inwardly from the contact surface 128 to a bond pad surface 124 (shown as 124a and 124b in FIG. 2) that is intermediate the back surface 130 and the contact surface 128, leaving a reduced-thickness base 122 (shown as 122a and 122b in FIG. 2) between the bond pad surface 124 and the back surface 130. A passage 134 extends through the base and may comprise an elongate slot that extends along the length of the array of terminals 114. The recess 132 extends laterally outwardly from the passage 134 in at least one area to define the bond pad surface 124.

Figure 1:
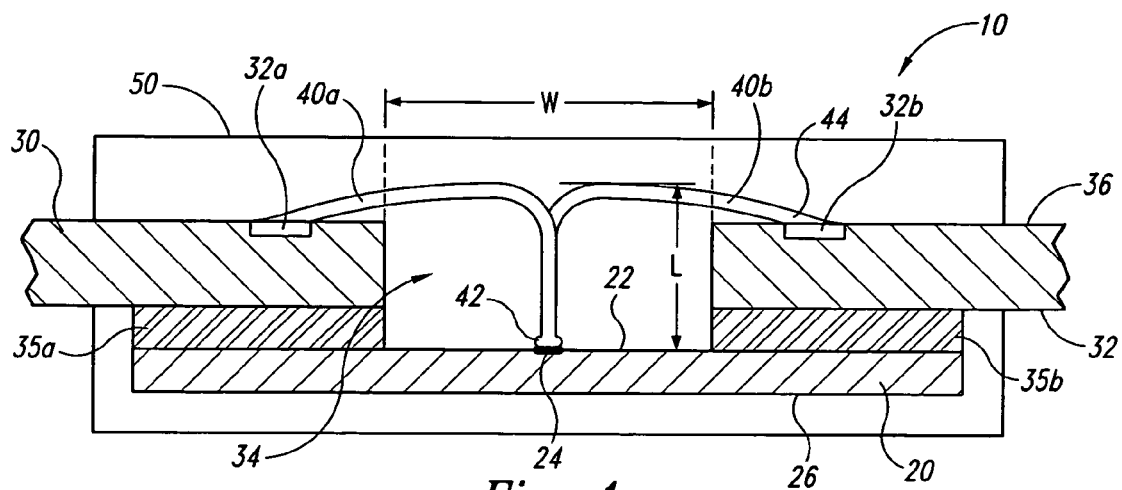
FIG. 1 is a schematic cross-sectional view of a conventional packaged microelectronic component assembly.

In the illustrated embodiment, the passage 134 may have a width W that is less than a width of the recess 132 and have a midline that generally bisects the width of the recess 132. This will define a first bond pad surface 124a extending along one edge of the passage 134 and a second bond pad surface 124b extending along the other edge of the passage 134. As explained below, aspects of the microelectronic component assembly 101 allow the width W of the recess 134 to be substantially smaller than the gap width W encountered in conventional designs such as the one shown in FIG. 1.

Any of a variety of common microelectronic component substrate materials may be used to form the substrate 120. For example, the substrate may have a laminate structure such as those used in some printed circuit boards. In one embodiment, the substrate 120 may be formed of a first ply or set of plies that define the thickness of the base 122 and a second ply or set of plies that have a thickness equal to the height of the recess $H_R$. If so desired, a printed circuit may be defined between the first and second plies to electrically connect the bond pads 125 to the contacts 129.

The substrate 120 may be attached to the microelectronic component 110 by means of an adhesive member. In the microelectronic component subassembly 101 of FIG. 2, the back surface 130 the substrate 120 is be attached to the active surface 112 of the microelectronic component 110 by a pair of spaced-apart adhesive members 135a and 135b. One adhesive member 135a may extend along one side of the passage 134 and the other adhesive member 135b may extend along the opposite side of the passage 134. In one embodiment, each of the adhesive members 135 comprises a length of a conventional die attach tape, e.g., a polyimide film such as KAPTON. In another embodiment, each adhesive member 135 comprises a quantity of a thermoplastic resin or a curable epoxy.

The contact surface 128 of the substrate 120 is spaced a first height $H_1$ from the active surface 112 of the microelectronic component 110. The bond pad surfaces 124a and 124b each may be positioned at a second height $H_2$ from the active surface 112. The first height $H_1$ is greater than the second height $H_2$, defining a recess height $H_R$ between the bond pad surfaces 124 and the contact surface 128 of the substrate 120. The relative dimensions of these heights $H_1$, $H_2$, and $H_R$ may be varied to meet the needs of a particular application.

In the embodiment shown in FIG. 2, the recess 132 defines a sharp change in thickness where the substrate body 126 adjoins the base 122. This is not necessary; the recess 132 may have a sloped, angled, or curved periphery to define a more gradual transition between the bond pad surface 124 and the contact surface 128.

FIG. 3 schematically illustrates a microelectronic component subassembly 102 that incorporates the microelectronic component subassembly 101 of FIG. 2. In particular, the device shown in FIG. 3 comprises the microelectronic component subassembly 101 of FIG. 2 with two or more bond wires attached thereto. In the cross-sectional view of FIG. 3, only two bond wires, a first bond wire 140a and a second bond wire 140b, are visible. The first bond wire 140a has a terminal end 142 bonded to one of the terminals 114 of the microelectronic component 110 and a bond pad end 144 attached to a bond pad (125a in FIG. 2) on the first bond pad surface 124a. The second bond wire 140b also has a terminal end 142 attached to one of the terminals 114 of the microelectronic component 110 and has a bond pad end 144 that is attached to a bond pad (125b in FIG. 2) on the opposite bond pad surface 124b. A terminal length 143 of each of the bond wires 140 may be positioned in the passage 134 and extend outwardly from the active surface 112 of the microelectronic component 110.

In the subassembly 102 of FIG. 3, each of the bond wires 140 has a maximum height L outwardly from the active surface 112 that is no greater than the height ($H_1$ in FIG. 2) of the contact surface 128 of the substrate 120. As a consequence, none of the bond wires 140 will extend outwardly beyond the plane of the contact surface 128. In FIG. 3, the maximum height L of the bond wires 140 is less than the height $H_1$, leaving the bond wires 140 spaced a distance D below the contact surface 128. In one particular embodiment, the recess height $H_R$ is at least about two times the diameter of the bonding wires 140. It is believed that a recess height $H_R$ of about 2-2.5 times the thickness of the bonding wire 140 will provide more than adequate manufacturing tolerances to ensure that the bond wires 140 do not extend outwardly beyond the contact surface 128.

Figure 4:
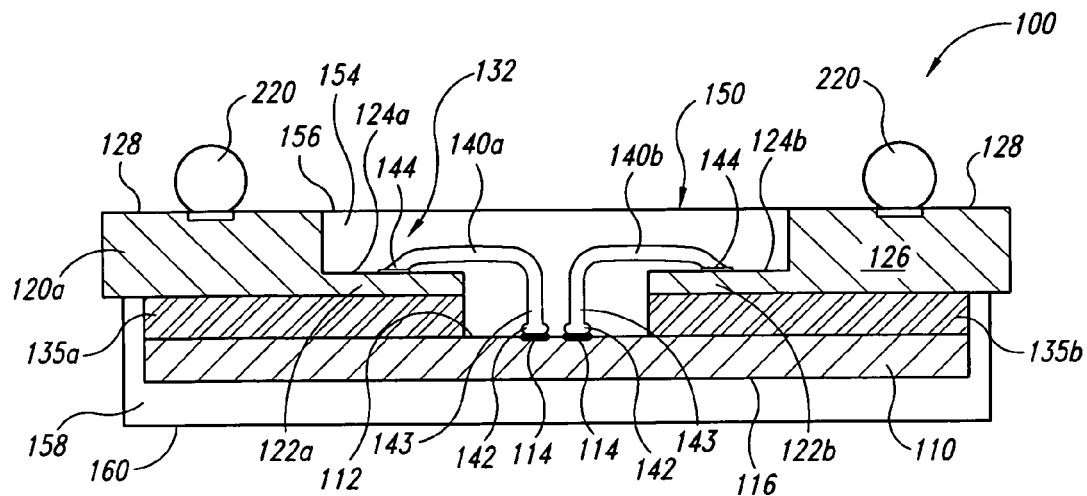
FIG. 4 is a schematic cross-sectional view of a packaged microelectronic component assembly in accordance with one embodiment of the invention that incorporates the microelectronic component subassembly of FIG. 3.

The microelectronic component subassembly 102 illustrated in FIG. 3 may be incorporated in a wide variety of microelectronic component assemblies. FIG. 4 illustrates one particular microelectronic component assembly 100 that is manufactured from the microelectronic component subassembly 102 of FIG. 3. The microelectronic component assembly 100 also includes a dielectric matrix 150 that covers the bond wires 140, the microelectronic component 110, and a portion of the substrate 120, leaving the contacts 129 of the contact surface 128 exposed for access instead of covered by the dielectric matrix 150. In the illustrated embodiment, the dielectric matrix 150 includes a first portion 154 and a second portion 158. The first portion 154 substantially fills the recess 132 and the passage (134 in FIG. 2). The second portion 158 defines a back surface 160 of the assembly 100. The first and second portions 154 and 158 may be formed during the same manufacturing step, e.g., in a single transfer molding operation. In another embodiment, the first portion 152 and the second portion 158 are formed in separate manufacturing steps.

In one embodiment, the first portion 154 of the dielectric matrix 150 may have a maximum height outwardly from the active surface 112 of the microelectronic component that is no greater than the height ($H_1$ in FIG. 2) of the contact surface 128 of the substrate 120. In the particular implementation illustrated in FIG. 4, the dielectric matrix 150 has an outer surface 156 that is substantially coplanar with the contact surface 128. This presents the microelectronic component assembly 100 with a relatively flat outer surface that comprises the outer surface 156 of the dielectric matrix 150 and the contact surface 128 of the substrate 120. In an alternative embodiment, the dielectric outer surface 156 is recessed below the contact surface 128, but still substantially encapsulates the bond wires 140.

The dielectric matrix 150 may be formed of any material that will provide suitable protection for the elements within the matrix 150. It is anticipated that most conventional, commercially available microelectronic packaging mold compounds may be useful as the dielectric matrix 150. Such mold compounds typically comprise a dielectric thermosetting plastic that can be heated to flow under pressure into a mold cavity of a transfer mold. In other embodiments, the dielectric matrix 150 may comprise a more flowable dielectric resin that can be applied by wicking under capillary action instead of delivered under pressure in a transfer mold.

As noted previously, terminal pitch and bond wire pitch in packaged microelectronic components (e.g., microelectronic component 10 of FIG. 1) are decreasing over time. The requisite smaller wire diameters and closer spacing exacerbates the previously noted problems associated with wire sweep. The microelectronic component assembly 100 of FIG. 4 can reduce some of these problems. Having the bond pads 125 (FIG. 2) of the substrate 120 positioned closer to the active surface 112 of the microelectronic component 110 reduces the spacing necessary for the reverse motion of the capillary of a wire bonding machine. This, in turn, permits the surfaces of the inner periphery of the passage (134 in FIGS. 2 and 3) to be positioned closer to one another, reducing the width (W in FIG. 2) of the opening through the substrate 120.

Because the bond wires 140 need not extend outwardly from the active surface 112 as far or extend laterally as far to reach the bond pads 125 of the substrate 120, the length of each of the bonding wires 140 can be materially reduced. Wire sweep increases as the bonding wires become longer. Shortening the bond wires 140, therefore, will reduce the wire sweep encountered for bond wires 140 having the same diameter, or it may permit the use of thinner (and cheaper) bond wires 140 that experience about the same degree of wire sweep.

The microelectronic component assembly 100 of FIG. 4 also includes an array of conductive structures 220 (only two of which are visible in this view). Each of the conductive structures 220 is carried on and is in electrical contact with one of the contacts 129 of the substrate 120. In FIG. 4, these conductive structures are typified as solder balls. Other suitable conductive structures may include conductive epoxy bumps or pillars, conductor-filled epoxy, or an anisotropic "Z-axis" conductive elastomer. These conductive structures 220 may be used to electrically connect the contacts 129 of the substrate 120 to another microelectronic component, e.g., a substrate such as a printed circuit board, using conventional flip chip or BGA techniques.

C. Methods of Manufacturing Microelectronic Component Assemblies

As noted above, other embodiments of the invention provide methods of manufacturing microelectronic component assemblies. In the following discussion, reference is made to the particular microelectronic component assemblies shown in FIGS. 2-4. It should be understood, though, that reference to these particular microelectronic component assemblies is solely for purposes of illustration and that the method outlined below is not limited to any particular microelectronic component assembly shown in the drawings or discussed in detail above.

In one embodiment, a method of the invention may include juxtaposing an active surface 112 of a microelectronic component 110 with the back surface 130 of a substrate 120. This may include aligning the passage 134 in the base 122 with the terminals 114 of the microelectronic component 110. Once the substrate 120 is in the desired position with respect to the microelectronic component 110, the substrate 120 may be attached to the active surface 112 of the microelectronic component 110 with the array of terminals 114 accessible through the passage 134. In one embodiment, this attachment is accomplished via a pair of adhesive members 135. If the adhesive members 135 each comprise a die attach tape, the first adhesive member 135a may be attached to the active surface 112 along a first longitudinal side of the array of terminals 114 and the second die attach tape 135b may be attached to the active surface 112 along the opposite side of the array of terminals. The substrate 120 may then be brought into contact with the outer surfaces of the adhesive members 135, thereby attaching the substrate 120 to the microelectronic component 110.

In one embodiment, at least two bond wires 140 are used to electrically couple the microelectronic component 110 to the substrate 120. Using a conventional, commercially available wire bonding machine, a terminal end 142 of a first bond wire 140a may be attached to one of the terminals 114 of the microelectronic component 110 and the bond pad end 144 of the first bond wire 140a may be bonded to a bond pad 125a on the bond pad surface 124 of the substrate 120. In a similar fashion, a second bond wire 140b may be attached to a second terminal 114 of the microelectronic component 110 and to another bond pad 125b. In one embodiment, each of the bond wires 140 has a maximum height outwardly from the active surface 112 of the microelectronic component 110 that is less than the height $H_1$, of the contact surface 128.

A dielectric matrix 150 may be used to protect the microelectronic component subassembly 102. For example, the microelectronic component assembly 100 shown in FIG. 4 may be formed by positioning the microelectronic component subassembly 102 in a transfer mold with the microelectronic component 110 and the bond wires 140 positioned in a mold cavity. A molten dielectric resin may then be delivered under pressure to fill the mold cavity, yielding a dielectric matrix 150 such as that shown in FIG. 4.

Figure 5:
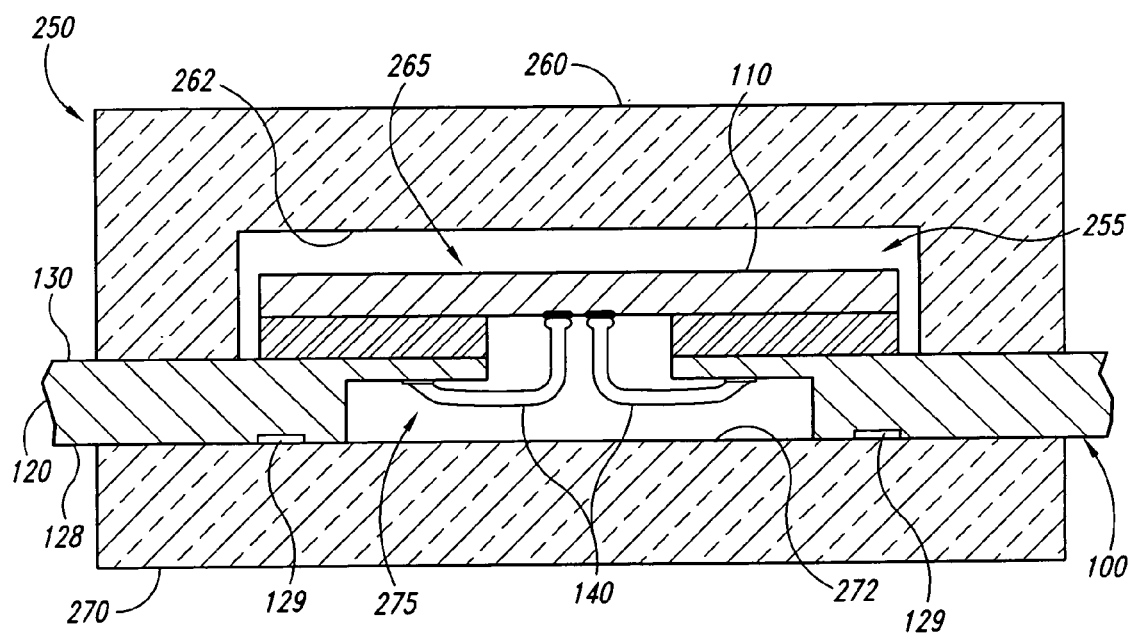
FIG. 5 is a schematic cross-sectional view of a stage in the manufacture of the packaged microelectronic component subassembly of FIG. 4.

FIG. 5 schematically illustrates a stage in a transfer molding operation in accordance with one embodiment of the invention. In this illustration, the microelectronic component subassembly 102 of FIG. 3 is positioned in a mold cavity 255 of a mold 250. The mold may comprise an upper mold element 260 having an inner surface that defines an upper mold cavity surface 262 and a lower mold element 270 having an inner surface that defines a lower mold cavity surface 272.

The back surface 130 of the substrate 120 may be spaced from the upper mold cavity surface 262, defining a first void 265 of the mold cavity 255. The contact surface 128 of the microelectronic component subassembly 102 may be oriented downwardly and disposed in contact with the lower mold cavity surface 272. This defines a second void 275 of the mold cavity 255 between the bond pad surface 124 and the lower mold cavity surface 272. The second void 275 is further bounded by the recess (132 in FIG. 2) and the passage (134 in FIG. 2) of the substrate 120 and the active surface (112 in FIG. 2) of the microelectronic component 110.

The first and second voids 265 and 275 may be substantially filled with a dielectric matrix (150 in FIG. 4) by delivering a molten mold compound to the mold cavity under pressure. In one particular implementation, the mold compound is delivered to the first void 265 before it is delivered to the second void. For example, the mold compound may be delivered adjacent an end of the first void 265, flow along the length of the first void 265 (perpendicular to the plane of the cross section of FIG. 5), then flow in the opposite direction to fill the second void 275. The weight of the microelectronic component subassembly 102 will help keep the contact surface 128 flush with the lower mold cavity surface 272. Delivering the mold compound to the first void 265 before delivering it to the second void 275 will further urge the contact surface 128 against the lower mold cavity surface 272, significantly limiting the likelihood that the mold compound will squeeze between the contact surface 128 and the lower mold cavity surface 272 to foul the contacts 129. In another embodiment, both voids 265 and 275 may be filled simultaneously. The pressure of the mold compound in the first void 265 will still help limit intrusion of the mold compound onto the contacts 129.

If necessary, any inadvertent flash coating of the dielectric matrix 150 on the contact surface 128 of the substrate 120 may be removed by etching or grinding. As noted above, though, this is less likely to occur than in conventional, substrate-up molding operations. The conductive structures 220 (FIG. 5) may be applied to some or all of the contacts 129 of the substrate 120 to define an array of conductive structures 220. The conductive structures 220 may be deposited using a solder mask/etch process, screen printing, or any of a number of other conventional techniques used in depositing solder balls, conductive epoxies, and other conductive structures.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments. In general, the terms used in the following claims should not be construed to limit the invention to the specific embodiments disclosed in the specification, unless the above-detailed description explicitly defines such terms.

We claim:

1. A microelectronic component assembly comprising:
a microelectronic component having an active surface and an array of terminals carried on the active surface;
a substrate attached to the active surface of the microelectronic component, the substrate having a body, a reduced-thickness base portion, and a passage through the base that is disposed adjacent the terminals of the microelectronic component, the body having a first thickness and a contact surface at a first height outwardly from the active surface of the microelectronic component, and the base having a second thickness and a bond pad surface at a second height outwardly from the active surface of the microelectronic component, the first thickness being greater than the second thickness, and the first height being greater than the second height; and at least one bond wire that extends through the passage and electrically couples one of the terminals of the microelectronic component to a bond pad carried by the bond surface of the substrate, the bond wire having a diameter and a maximum height outwardly from the active surface of the microelectronic component that is no greater than the first height, wherein the difference between the first height and the second height is approximately 2-2.5 times greater than the diameter of the bond wire.

2. The microelectronic component assembly of claim 1 wherein the substrate includes a recess that extends inwardly from the contact surface to the bond pad surface and the bond pad surface is defined by a dimension of the recess that exceeds a corresponding dimension of the passage.

3. The microelectronic component assembly of claim 2 further comprising a dielectric matrix extending into the recess and covering at least a portion of the bond pad surface.

4. The microelectronic component assembly of claim 1 wherein the substrate includes a recess that extends inwardly from the contact surface to the bond pad surface and the microelectronic component assembly further comprises a dielectric matrix extending into the recess and having a maximum height outwardly from the active surface of the microelectronic component that is no greater than the first height.

5. The microelectronic component assembly of claim 1 further comprising a dielectric matrix covering at least a portion of the bond pad surface and a portion of the active surface of the microelectronic component.

6. The microelectronic component assembly of claim 1 further comprising a dielectric matrix at least partially covering each of the bond wires.

7. The microelectronic component assembly of claim 1 wherein the at least one wire bond includes a substantially flat segment between the corresponding terminal and bond pad.

8. A microelectronic component assembly comprising:
a microelectronic component having an active surface that carries a first terminal and a second terminal;
a substrate attached to the active surface of the microelectronic component, the substrate having a body, a reduced-thickness base portion, and a passage through the base portion that is disposed adjacent the terminals of the microelectronic component, the body having an outer surface at a first height outwardly from the active surface of the microelectronic component and the base portion having a bond surface at a second height outwardly from the active surface of the first microelectronic component, the first height being greater than the second height;

a first bond wire electrically coupling the first terminal to a first bond pad carried by the bond surface and a second bond wire electrically coupling the second terminal to a second bond pad carried by the bond surface, each of the first and second bond wires having a diameter and a maximum height outwardly from the active surface of the microelectronic component that is no greater than the first height, wherein the difference between the first and second height is approximately 2-2.5 times greater than the diameter; and a conductive structure coupled to a contact carried by the contact surface.

9. The microelectronic component assembly of claim 8 wherein the first and second bond wires each include a substantially flat segment between the corresponding terminals and bond pads.

10. A microelectronic component assembly comprising:
a microelectronic component having an active surface that carries a first terminal and a second terminal;
a substrate attached to the active surface of the microelectronic component, the substrate having a body, a reduced-thickness base portion, and a passage through the base portion that is disposed adjacent the terminals of the microelectronic component, the body having an outer surface at a first height outwardly from the active surface of the microelectronic component and the base portion having a bond surface at a second height outwardly from the active surface of the first microelectronic component, the first height being greater than the second height;
a first bond wire electrically coupling the first terminal to a first bond pad carried by the bond surface and a second bond wire electrically coupling the second terminal to a second bond pad carried by the bond surface, each of the first and second bond wires having a diameter and a maximum height outwardly from the active surface of the microelectronic component that is no greater than the first height, wherein the difference between the first and second height is approximately 2-2.5 times greater than the diameter;
a conductive structure coupled to a contact carried by the contact surface; and
a dielectric matrix covering the microelectronic component, the first and second bond wires, and the bond pad surface, wherein difference between the first and second height at least partially prevents the first bond wire from contacting the second bond wire when the encapsulate is disposed over the first and second bond wires.

* * * * *

UNITED STATES PATENT AND TRADEMARK OFFICE
CERTIFICATE OF CORRECTION

PATENT NO. : 7,365,424 B2
APPLICATION NO. : 11/437397
DATED : April 29, 2008
INVENTOR(S) : Seng et al.

It is certified that error appears in the above-identified patent and that said Letters Patent is hereby corrected as shown below:

In column 10, line 52-53, in Claim 10, delete "encapsulate" and insert -- encapsulant --, therefor.

Signed and Sealed this

Twenty-ninth Day of July, 2008

JON W. DUDAS
*Director of the United States Patent and Trademark Office*